(12) United States Patent
Ouchi et al.

(10) Patent No.: US 9,236,833 B2
(45) Date of Patent: Jan. 12, 2016

(54) ELECTROMAGNETIC WAVE GENERATION DEVICE AND DETECTION DEVICE

(71) Applicant: CANON KABUSHIKI KAISHA, Tokyo (JP)

(72) Inventors: Toshihiko Ouchi, Machida (JP); Ryota Sekiguchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/155,033

(22) Filed: Jan. 14, 2014

(65) Prior Publication Data

US 2014/0197896 A1    Jul. 17, 2014

(30) Foreign Application Priority Data

Jan. 16, 2013 (JP) ................................. 2013-005056
Nov. 13, 2013 (JP) ................................. 2013-234730

(51) Int. Cl.
| | |
|---|---|
| H03B 7/08 | (2006.01) |
| H03B 7/00 | (2006.01) |
| H03C 7/02 | (2006.01) |
| H03B 17/00 | (2006.01) |
| H03C 7/00 | (2006.01) |

(52) U.S. Cl.
CPC .. *H03B 7/08* (2013.01); *H03B 7/00* (2013.01); *H03B 17/00* (2013.01); *H03C 7/00* (2013.01); *H03C 7/025* (2013.01); *H03B 2200/0084* (2013.01)

(58) Field of Classification Search
CPC ............ H03B 7/00; H03B 9/12; H03B 17/00; H03B 2200/0084; H03B 2200/0028; H03B 7/08; H03C 7/00; H03C 7/02; H03C 7/025; H03C 7/027; H03C 1/02
USPC ......... 331/115, 107 T, 132, 107 G, 107 S, 47; 332/149, 163, 179; 257/25, 26, 27
See application file for complete search history.

(56) References Cited

U.S. PATENT DOCUMENTS

| | | | |
|---|---|---|---|
| 7,420,225 B1* | 9/2008 | Wanke et al. .................. | 257/192 |
| 2013/0342279 A1* | 12/2013 | Sensale-Rodriguez et al. ............................ | 332/179 |

FOREIGN PATENT DOCUMENTS

| | | |
|---|---|---|
| JP | 2005-142476 A | 6/2005 |
| JP | 2009-224467 A | 10/2009 |

OTHER PUBLICATIONS

Pala et al., "Resonant Detection and Modulation of Terahertz Radiation by 2DEG Plasmons in GaN Grating-Gate Structures", Sensors, 2007 IEEE. IEEE, 2007.*
Orihashi et al.,"One THz harmonic oscillation of resonant tunneling diodes", Applied Physics Letters 87.23 (2005): 233501.*
Rahm et al., "THz Wave Modulators: a Brief Review on Different Modulation Techniques", Journal of Infrared, Millimeter, and Terahertz Waves 34.1 (2013): 1-27.*
Reddy et al., "Bias Stabilization for Resonant Tunnel Diode Oscillators", IEEE Microwave and Guided Wave Letters, Jul. 1995, pp. 219-221, vol. 5, No. 7.

* cited by examiner

*Primary Examiner* — Ryan Johnson
(74) *Attorney, Agent, or Firm* — Canon U.S.A., Inc. IP Division

(57) ABSTRACT

The invention provides an electromagnetic wave generation device. The device includes a substrate provided with a terahertz wave oscillation section including a resonant tunneling diode structure, a two-dimensional electron layer having a semiconductor heterojunction structure, and a transistor section including a source electrode and a drain electrode provided at end portions of the two-dimensional electron layer and a gate electrode provided above the two-dimensional electron layer. The terahertz wave output of the terahertz wave oscillation section changes distribution of electrons in the two-dimensional electron layer.

10 Claims, 4 Drawing Sheets

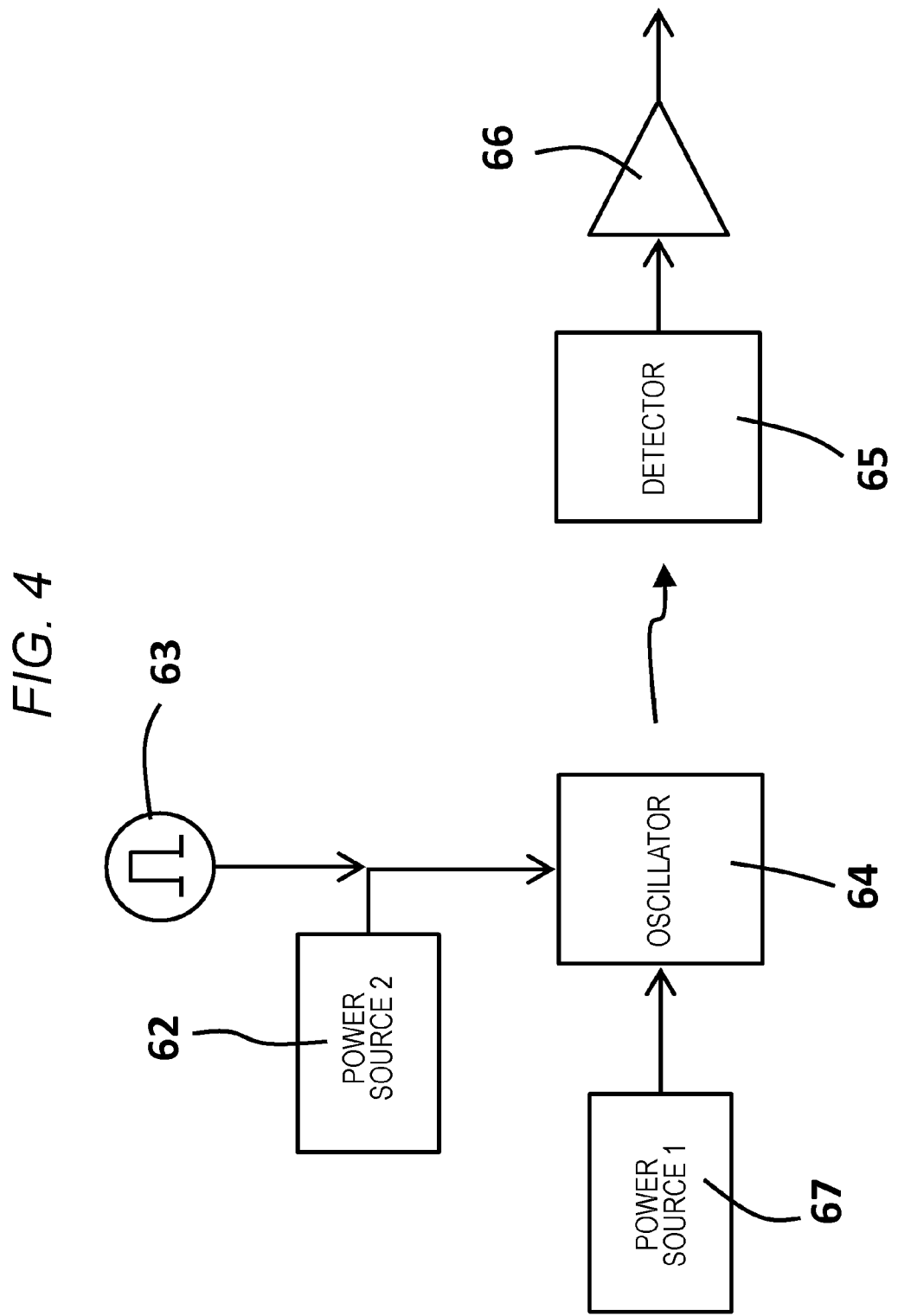

ELECTROMAGNETIC WAVE GENERATION DEVICE AND DETECTION DEVICE

BACKGROUND OF THE INVENTION

1. Field of the Invention

The present invention relates to an oscillation device, a detection device, and the like, of a semiconductor, for a terahertz waveband.

2. Description of the Related Art

In recent years, non-destructive sensing techniques using electromagnetic waves in a terahertz (THz) waveband (at frequencies of approximately 30 GHz to 30 THz) have been developed. Electromagnetic waves in such a frequency band allow applications in imaging techniques developed in the form of safe imaging and examining apparatuses without the use of X-rays. Other techniques that have been developed include spectroscopic techniques for obtaining the absorption spectrum and the complex permittivity of a substance to determine its properties such as molecular bonding, measurement techniques for determining properties such as carrier density and mobility, conductivity, and the like, and analytic techniques for biomolecules. Additionally, the IEEE802.15 THz Interest Group has been active in the development of wide-band wireless communications using THz waves as carrier waves.

Light sources for such THz waves have been developed using nonlinear phenomena through laser excitation or using photoconductivity of semiconductors. Microwave-band oscillators that multiply waves are also used. However, they all suffer difficulty in improving the efficiency of generating THz waves and have complex configurations, and thus there is demand for semiconductor chips that can be driven electrically. One such oscillator is a resonant tunneling diode (RTD) device (see IEEE Microwave and Guided wave letters, vol. 5, p. 219, 1995.). This device, through electromagnetic wave gain due to the negative resistance of the RTD and the integration of a resonator that also works as an electromagnetic wave emitter, provides oscillation output in a terahertz waveband with voltage application at room temperatures.

Other attempts include integrating such a device having the negative resistance with a transistor device for amplification and mixing of the oscillation output to thereby improve the performance of space transmission by high frequency electromagnetic waves (Japanese Patent Application Laid-Open No. 2005-142476).

An HEMT (high electron mobility transistor) device provided with grating electrode gates has been disclosed as one type of high speed transistor (see Japanese Patent Application Laid-Open No. 2009-224467). In this device, the frequency of a plasmon occurred in a two-dimensional electron gas region is adjusted through the grating electrode gates. External rays of light with two wavelengths are allowed to enter the device, and the beat frequency is tuned in the resonance frequency of the plasmon to generate THz waves.

An RTD oscillator necessitates the integration of a shunt resistor and a MIM capacitor in proximity to an RTD device to oscillate at a desired oscillation frequency. Depending on the structure of a resonator required for the oscillator, there may be problems as described below. That is, the structural size may be limited for obtaining a resistance value required for the integrated-type shunt resistor, and the application of a modulation signal from an external power source may impose an upper limit of approximately 10 GHz by the MIM capacitor required to prevent parasitic oscillation. Note that this calculation assumes a modulation bandwidth of 3 db down, MIM capacitance of 10 pF, and wiring resistance slightly less than 1Ω.

By integrating this type of oscillator with a transistor as described in Japanese Patent Application Laid-Open No. 2005-142476 to obtain an amplifying function, the transistor may provide a modulating function to alleviate the problems described above. Fabricating such an integrated circuit for a terahertz region, however, may require highly accurate shape control, making it difficult to obtain a high yield.

SUMMARY OF THE INVENTION

An aspect of the invention is an electromagnetic wave generation device, the device including a substrate, the substrate being provided with a terahertz wave oscillation section including a resonant tunneling diode structure, a two-dimensional electron layer having a semiconductor heterojunction structure, and a transistor section including a source electrode and a drain electrode provided at end portions of the two-dimensional electron layer and a gate electrode provided above the two-dimensional electron layer, wherein a terahertz wave output of the terahertz wave oscillation section changes distribution of electrons in the two-dimensional electron layer.

Further features of the present invention will become apparent from the following description of exemplary embodiments with reference to the attached drawings.

BRIEF DESCRIPTION OF THE DRAWINGS

FIG. 4 is a diagram for describing signal transmission using the electromagnetic wave generation device according to the invention.

DESCRIPTION OF THE EMBODIMENTS

In some embodiments described herein, an interaction between the output of an oscillator oscillating stably and an oscillator capable of high speed modulation achieves high-speed signal modulation and the like. Specifically, in an electromagnetic wave generation device, a certain voltage corresponding to a negative resistance region is applied to a resonant tunneling diode oscillator to obtain oscillation, and this output is allowed to enter a two-dimensional electron layer of an HEMT device, and the presence of the oscillation of the HEMT device is controlled by voltage applied to the HEMT device. This allows high speed modulation with a relatively simple configuration using the HEMT device, which is capable of the high speed modulation. To enable this operation and the like, the device according to some embodiments includes a substrate provided with a terahertz wave oscillation section including a resonant tunneling diode structure, a two-dimensional electron layer having a semiconductor heterojunction structure to configure the HEMT device, and a transistor section including a source electrode, a drain electrode, and a gate electrode. In the electromagnetic wave generation device, the terahertz wave output of the terahertz wave oscillation section changes the distribution of electrons in the two-dimensional electron layer. The distribution of electrons in the two-dimensional electron layer can be changed by positioning the terahertz wave oscillation section such that its terahertz wave output enters the two-dimensional electron layer.

First Embodiment

Figure 1A:
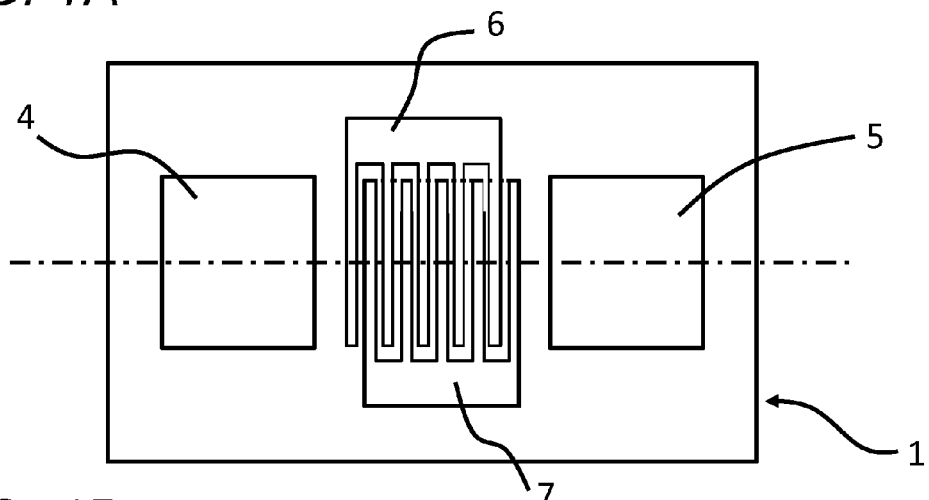
FIG. 1A is a block diagram of an electromagnetic wave generation device according to a first embodiment of the present invention.
Figure 1B:
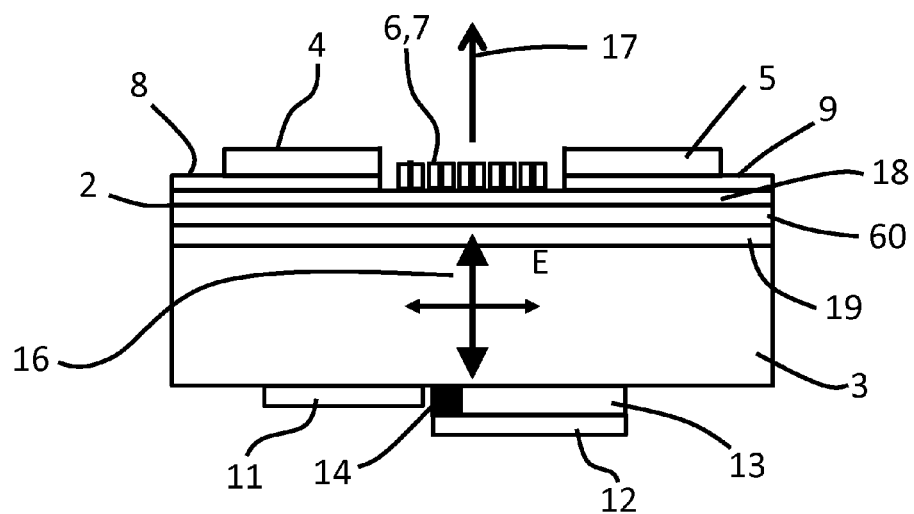
FIG. 1B is a block diagram of the electromagnetic wave generation device according to the first embodiment of the invention.
Figure 1C:
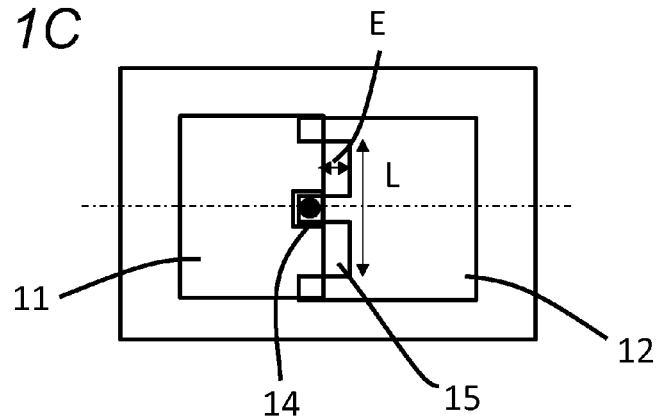
FIG. 1C is a block diagram of the electromagnetic wave generation device according to the first embodiment of the invention.

A first embodiment of the present invention provides an electromagnetic wave generation device or an oscillation device 1, which is provided with an RTD oscillator (FIG. 1C) and an HEMT device (FIG. 1A) on one substrate on its different surfaces as illustrated in FIGS. 1A to 1C. In other words, structures illustrated in FIGS. 1A and 1C in plan views are integrated on an identical substrate 3 with a cross-sectional structure illustrated in FIG. 1B in a sectional view taken along long dashed short dashed lines in the figures. The HEMT device includes grating gate electrodes 6 and 7 to be able to adjust the frequency of a plasmon occurred at a two-dimensional electron layer 2 having a semiconductor heterojunction structure. The RTD oscillator, which is a terahertz wave oscillation section including a resonant tunneling diode structure, is configured to be able to oscillate at a frequency determined by a length L of an antenna 15 provided as a resonator and an emitter. An output of the RTD oscillator propagates in the substrate 3 as marked with reference numeral 16 and enters the two-dimensional electron layer of the HEMT device at a region beneath the gate electrodes to allow an interaction with the plasmon occurring there. When a frequency of the plasmon and an oscillation frequency of the RTD oscillator are able to be tuned in a lock range, the HEMT device oscillates at the oscillation frequency of the RTD oscillator by the same principle described in Japanese Patent Application Laid-Open No. 2009-224467, which allows the HEMT device to radiate the oscillation output to an external space as marked with reference numeral 17. The electromagnetic waves emitted into the substrate from the RTD oscillator in this manner are allowed to interact with the HEMT device directly, thereby alleviating the difficulty of accurate integration alignment.

The devices will now be described. The RTD oscillator includes two electrodes 11 and 12 and an RTD section 14. In this device, the two electrodes 11 and 12 are isolated from each other with regard to direct current by an insulation film 13 and the like, provided at an overlapping portion of the electrodes, but are in conduction at the oscillation frequency of the oscillator to function as a slot antenna having a rectangular non-electrode portion as marked with reference numeral 15 in FIG. 1C. A part of the electrode 12 extends into the non-electrode portion like a protrusion to be in electrical contact with a surface of the RTD section 14. A layer of the RTD section at the side of the substrate 3 is in electrical contact with the electrode 11 through a heavily doped layer (not shown). The RTD section has a double-barrier or triple-barrier configuration including an InGaAs well layer and an InAlAs tunnel barrier layer (or possibly InAs) in the case in which the substrate 3 is of, for example, InP (semi-insulating). The length L of a long side of the slot antenna primarily determines the oscillation frequency, but the oscillation frequency also varies with a cross-sectional area of a mesa of the RTD section 14 and the position of the protrusion of the electrode 12 in relation to the long side of the slot antenna (the position being a position between the center of the long side and a short side of the slot antenna, and this position is at the center of the long side in FIG. 1C). This type of configuration for an RTD oscillator, which is described in an IEEE Microwave and Guided wave letters, vol. 5, p. 219, 1995, "Applied Physics Express, vol. 4, p. 064101," is well known to those skilled in the art.

Applying a DC voltage to the electrodes 11 and 12 results in oscillation in a terahertz region, and this oscillation output is emitted mainly toward the substrate 3 with high permittivity. As a result, the output enters the two-dimensional electron layer 2 of the HEMT device to cause the interaction described above. Here, it is important that electric field E generated at the slot antenna in a direction of its short side as illustrated in FIG. 1B makes an entry in a direction orthogonal to a longitudinal direction of a grating of the grating gate electrodes of the HEMT device.

The HEMT device will now be described. An InAlAs buffer layer 19, an InGaAs channel layer 60, and an InAlAs carrier supply layer 18 are arranged on the semi-insulating InP substrate 3 that is provided with the RTD section, and the grating gate electrodes 6 and 7 are formed on a surface of the InAlAs carrier supply layer 18. These heteroepitaxial layers are non-doped layers in principle, but delta doping with Si near an interface of the carrier supply layer 18 with the channel layer 60 results in the two-dimensional electron layer 2 formed near the interface of the two layers. A source electrode 4 and a drain electrode 5 are formed at end portions of the two-dimensional electron layer outside a region corresponding to the gate electrodes, with heavily doped n+InGaAs layers or ion-implanted layers 8 and 9 provided beneath the source electrode 4 and the drain electrode 5 to obtain ohmic contact. To obtain electrode contact with the n+InGaAs layers, an n+InGaAs layer is further formed through epitaxial growth on a semiconductor layer structure identical to that of the gate region, and this layer alone is selectively etched to be removed in the gate region. Suitable electrode materials include Ti/Pt/Au and Ti/Pd/Au, or Mo, TiW, and polysilicon having the lower plasma frequencies. An arrangement of a typical HEMT device has been described. Additionally, in this embodiment, the gate electrodes 6 and 7 have interdigital structures, so that a potential difference between the adjacent grating electrodes can be adjusted. The transistor section is arranged in this manner to include the source electrode and the drain electrode provided at the end portions of the two-dimensional electron layer and the gate electrodes provided above the two-dimensional electron layer. With the arrangement described above, the terahertz wave output of the terahertz wave oscillation section propagates inside the substrate to be able to change the distribution of electrons in the two-dimensional electron layer.

These two devices can be integrated on the identical InP substrate 3 through the epitaxial growth and alignment patterning with a double sided aligner to achieve the interaction by the terahertz electromagnetic waves. While the terahertz wave oscillation section and the transistor section are arranged on two different surfaces of the substrate 3 at opposite positions in the arrangement described above, an alternative may be viable. That is, the RTD oscillator and the HEMT device may be fabricated on separate substrates, which then may be hybrid integrated by joining the substrates with an adhesive having electromagnetic wave permeability, by joining the substrates directly, or by joining metals, such as Au, shaped to avoid the region of the electromagnetic wave interaction. In any manners described above, the transistor section is arranged so as to achieve the interaction with the output of the terahertz wave oscillation section.

An operation of the device of the invention will now be described. The emission of a terahertz wave from the HEMT device is basically by an emission principle similar to that described in Japanese Patent Application Laid-Open No. 2009-224467. That is, the application of voltage between the source and the drain causes drift current due to two-dimensional electrons at the two-dimensional electron layer. When the frequency of the plasmon oscillation that can be caused by periodic density modulation of the two-dimensional electrons by the grating gate electrodes achieves a predetermined relationship with the widths (gate lengths) of the gate gratings, amplification gain is obtained. With a typical carrier density of $10^{11}$ to $10^{12}$ cm$^{-2}$ in the two-dimensional electron layer, the two-dimensional electrons can induce the plasmon as coherent polarization oscillations by photons in a terahertz band. The voltage between the source and the drain and a gate voltage are used to adjust the carrier density of the two-dimensional electrons, the electron concentration of the grating region, the drift velocity of electrons, and the like to provide the amplification gain at the frequency of terahertz electromagnetic waves from the RTD oscillator. In this manner, the electromagnetic waves, with the oscillation frequency fixed by the RTD oscillator, can be emitted with the amplified output.

Here, the carrier density can be changed by changing the gate voltage for detuning from the amplifiable frequency to achieve a transition so that the electromagnetic waves are not emitted to the outside. Hence, the application of a modulation signal to the gate electrodes of the HEMT device allows on/off-modulated terahertz electromagnetic waves to radiate to the outside. The roll-off frequency to the application of the modulation signal due to parasitic impedance of the device can be made several hundred GHz or greater, depending to some extent on the gate lengths as with a common HEMT device. In this manner, modulation with a significantly wider band is viable in contrast to an approach with the application of a modulation signal to an RTD oscillator alone. For InP, applying 0.3 V to the electrode 6 and 1 V to the electrode 7 typically induces carriers with densities of approximately $10^{12}$ cm$^{-2}$ and $10^{14}$ cm$^{-2}$ beneath the respective electrodes. For example, adjustment to the $10^{12}$ cm$^{-2}$ region to obtain agreement between the oscillation frequency of the RTD oscillator and the plasma frequency induces plasma resonance in a portion of the electrode 6 alone at a period of grating pitch of the grating electrodes. This plasma resonance is emitted as electromagnetic waves from the entire grating gate electrodes to the outside.

Applying 0 V to the electrode 7 reduces the carrier density thereof to lower than that of the region of the electrode 6 and thus reduces a concentration difference of the plasma resonance (a magnitude width), thereby preventing the electromagnetic waves from being emitted. Hence, applying a square wave modulation signal of, for example, 0 to 1 V, to the electrode 7 enables intensity modulation of the terahertz electromagnetic waves. For an oscillation frequency of, for example, 1 THz, the gate lengths (grating widths) of the electrodes for inducing the plasma resonance are on the sub-micron order. As an example, an arrangement below may provide an exemplary embodiment. Here, one electrode has a gate length of 100 nm, and the other electrode has a gate length of 1800 nm, with 40 periods of a structure having a pitch of 2 μm per period. The distance from the source to the drain is approximately 80 μm.

Note that these specific values are provided as a design example, and the oscillation frequency, driving conditions, and the like can be set in accordance with materials, carrier densities, and grating electrode sizes (gate lengths, the ratio of the two gate lengths, and a pitch). Guidelines for such designing can be found in, for example, "Physical Review B, vol. 58, p. 1517," which is an IEEE Microwave and Guided wave letters, vol. 5, p. 219, 1995. Additionally, as described in Japanese Patent Application Laid-Open No. 2009-224467, changing the gate lengths in stages from the source to the drain may bring about further efficient emission.

The description above assumes the use of only the amplification of the plasmon resonance between the source and the drain for the emission of electromagnetic waves from the HEMT device. Here, the emitted terahertz electromagnetic waves can be confined in a substrate resonator to improve Q-value, thereby further enhancing frequency stability and intensifying the oscillation output. In other words, in the case of the semi-insulating substrate 3, the attenuation of the terahertz wave is extremely small. Such a substrate 3 having a thickness of, for example, an integral multiple of λ/2 of the oscillation wavelength can be a vertical resonator with reflecting mirrors of electrodes 11 and 12 of the RTD oscillator and the electrodes 4 to 7 of the HEMT device. The refractive index of InP is approximately 3.5 for 1 THz oscillation, and thus the substrate 3 having a thickness of 510 μm for an effective wavelength 85 μm for 1 THz can function as a 6λ resonator. To change the oscillation wavelength, a different substrate thickness may be selected or the substrate may be polished to adjust the structure.

The specific examples in the embodiment described above have been provided as examples. For example, the semiconductor to be used may be GaAs based (AlGaAs, InGaAs, InGaP) or GaN based (InGaN, AlGaN), instead of InP based. Additionally, in the case in which an RTD oscillator and an HEMT device are hybrid integrated, different crystals of, for example, InP based and GaAs based may be combined for each device.

FIG. 4 is a diagram of an example of transmission of a terahertz wave signal by the oscillator according to the present embodiment. An electromagnetic wave generator including the electromagnetic wave generation device according to this embodiment is connected to a direct current power source 67 for driving the RTD oscillator and to a power source 62 for driving the HEMT device. A modulation power source 63 superimposes a modulation signal on the gate electrodes of the HEMT device. As an example, 0.8 V is applied to the RTD oscillator, 2.8 V is applied between the source and the drain of the HEMT device, and 0.3 V and 1 V are applied between the source and the two gates, respectively, to achieve oscillation at 0.8 THz. A modulation signal of 0 to 1 V is then supplied to the latter gate electrode to obtain approximately 30 GHz in the form of a modulation bandwidth of 3 dB down. For a detection section 65, for example, a schottky-barrier diode and a low noise amplifier 66 may be used. With the arrangement as described above, high speed wireless transmission can be performed using the 8B10B code at 10 Gbps. Furtherance of high frequency can be achieved by a different design, for example, for the gate lengths of the HEMT device.

Second Embodiment

Figure 2A:
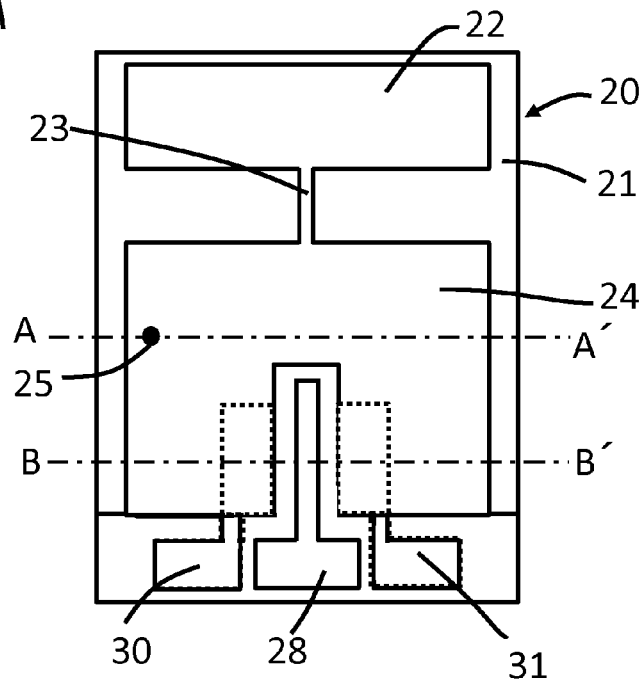
FIG. 2A is a block diagram of an electromagnetic wave generation device according to a second embodiment of the invention.

In the first embodiment, two surfaces of a substrate are used for the interaction of the RTD oscillator and the HEMT device, whereas this embodiment provides a device with the two devices integrated on an identical surface of a substrate 20. FIG. 2A is a plan view of this device, FIG. 2B is a sectional view along A-A', and FIG. 2C is a sectional view along B-B'.

Figure 2B:
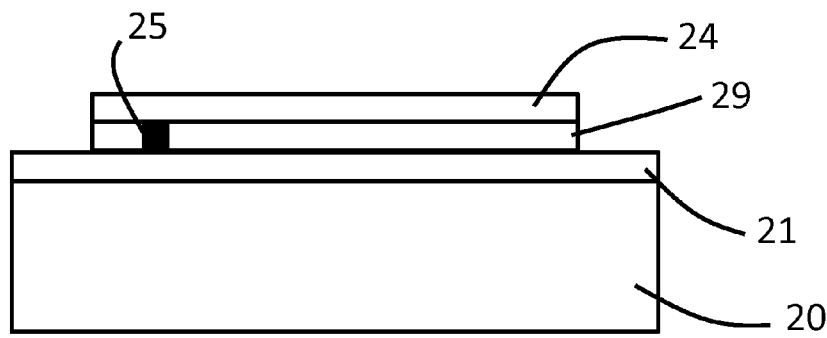
FIG. 2B is a block diagram of the electromagnetic wave generation device according to the second embodiment of the invention.
Figure 2C:
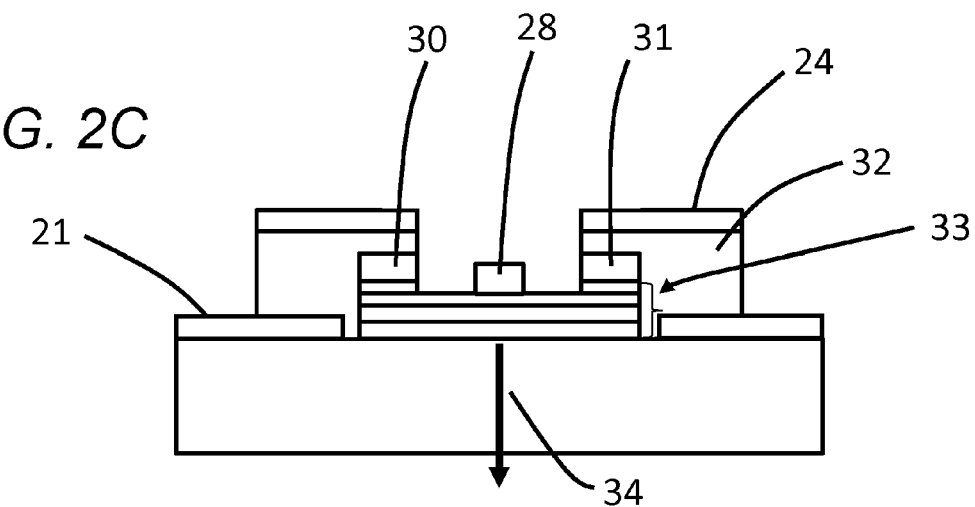
FIG. 2C is a block diagram of the electromagnetic wave generation device according to the second embodiment of the invention.

A typical arrangement of an RTD oscillator is illustrated in FIG. 2B in a sectional view. An RTD section 25 having a mesa structure as in the first embodiment and an insulator 29 are interposed between two electrodes 21 and 24. In this embodiment, an antenna provided as a resonator and an emitter is a patch antenna, and the RTD oscillator oscillates at an oscillation frequency determined by an antenna length with a bias supply line 23 as a null point. Applying a DC voltage from a power source through a pad 22 to the electrodes 21 and 24 allows the RTD oscillator to oscillate at the predetermined frequency. A standing wave from the oscillation has antinodes at a left end and a right end of the electrode 24 in FIG. 2A. The terahertz wave electric field of the standing wave is applied to a source electrode 30 and a drain electrode 31 of an HEMT device illustrated in FIG. 2C in a sectional view. The patch antenna electrode 24 of the RTD oscillator is insulated from the source and drain electrodes 30 and 31 by an insulation film 32 connected to the insulator 29, and only an AC component, which is a terahertz wave from the oscillation, is applied to the electrodes 30 and 31 of the HEMT device. The electrode 21, which is a ground electrode, is arranged such that it is absent beneath a semiconductor region 33 of the source and the drain as illustrated in FIG. 2C. Consequently, reduced efficiency of signal coupling between the RTD oscillator and the HEMT device can be set, in contrast to an arrangement with a connection with regard to direct current, increasing flexibility in design. Additionally, the HEMT device is in part of the antenna of the oscillator in this arrangement, precluding high frequency wiring such as a microstrip line, which in turn precludes a problem of a propagation loss or a yield reduction due to wiring.

An arrangement of the HEMT device (the layer configuration of the semiconductor region 33, and an arrangement of electrodes, such as a gate electrode 28, the source electrode 30, and the drain electrode 31) is similar to that in the first embodiment. A gate voltage set so as to obtain the plasmon resonance allows the amplification of electromagnetic waves emitted from the patch antenna to be greater than the output of the RTD oscillator alone. This can be used to perform intensity modulation of the terahertz electromagnetic waves. Alternatively, to achieve separation from the output of the RTD oscillator, the terahertz wave output from the HEMT device may be radiated from a surface of the substrate 20 opposite to the surface with the devices formed thereon, as marked with reference numeral 34. In this case, an anti-reflection coating, a hemispherical lens, and the like (not shown) may be formed as appropriate on the surface of the substrate 20 with no devices formed thereon.

Additionally, while the gate electrode 28 has a single electrode arrangement to adjust the carrier density, grating gate electrodes may be used as in the first embodiment. Furthermore, to achieve the single electrode 28, a quantum wire structure having an array of alternate submicron regions with different carrier densities as described in the first embodiment may be provided at a carrier supply layer beneath the gate electrode in place of the grating electrodes.

As described above, in this embodiment, electrical wiring (an antenna in this embodiment) to propagate the terahertz wave output from a terahertz wave oscillation section is connected with regard to alternating current to a transistor section. In other words, the connection from the terahertz wave oscillation section to the transistor section is in conduction at a frequency band of the terahertz waves from the oscillation and is isolated with regard to direct current. This embodiment offers an advantage of alleviating difficulty in processing and alignment of two surfaces of a substrate.

Third Embodiment

Figure 3:
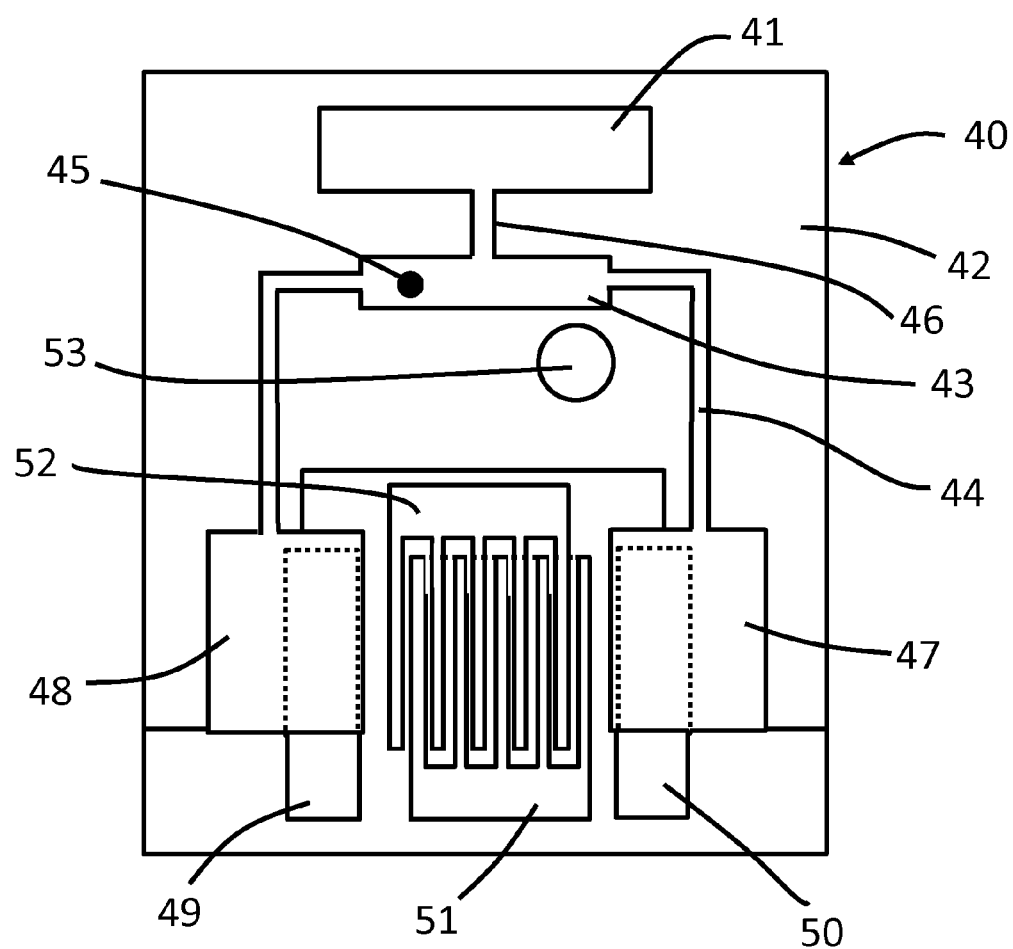
FIG. 3 is a block diagram of an electromagnetic wave generation device according to a third embodiment of the invention.

FIG. 3 is a plan view of an oscillation device 40 according to a third embodiment, which is a modification of a structure with two devices integrated on an identical plane as with the second embodiment. In the second embodiment, which combines the RTD oscillator and the HEMT device, the oscillation output of the RTD oscillator is separated from the output of the HEMT device with difficulty. As illustrated in FIG. 3, the present embodiment is not designed to allow the output of an RTD oscillator to be emitted from an antenna to the outside, but is designed to apply the oscillation output to electrodes 49 and 50 of an HEMT device through a transmission line 44.

In an RTD oscillator with an electrode 43 serving as a resonator, an RTD section 45, as in the first and second embodiments, and an insulation film, not shown, are interposed between an electrode 42 and the electrode 43. The electrode 43 constitutes the resonator of the RTD oscillator and may be provided with a circular dielectric section 53 in proximity to further increase the Q-value of the resonator. The height of the dielectric section 53 is approximately up to the height of the electrode 43 and the transmission line 44.

The oscillation output of the RTD oscillator is transmitted through transmission lines formed by reference numerals 44 and 42 to electrodes 48 and 47, and AC electric fields of the oscillation output transmitted to the electrodes 48 and 47 are applied to the source electrode 49 and the drain electrode 50 of the HEMT device. In this arrangement, a short circuit with regard to direct current is prevented between the electrode 48 and the electrode 49 and between the electrode 47 and the electrode 50, as with the cross-sectional structure (FIG. 2C) described in the second embodiment. Grating gate electrodes 51 and 52 are similar to those in the first embodiment. Reference numeral 41 represents a pad, and reference numeral 46 represents a bias supply line to the RTD oscillator.

In this embodiment, in the oscillator with two devices integrated on an identical plane, a modulated terahertz wave from the HEMT device can be radiated efficiently.

Fourth Embodiment

While the devices according to the embodiments described above operate as an oscillator, the devices may be used as detection devices. In such a detection device, a detection signal of an external terahertz wave the device is irradiated with can be obtained in the form of drain voltage and drain current. The drain voltage and the drain current increase when a gate voltage is before proximity to a threshold voltage (in a case with the voltage) or after the proximity to the threshold voltage (in a case with the current). Thus, the gate electrode voltage, at which the frequency of a terahertz electromagnetic wave to be detected agrees with the frequency of the plasmon induced at the two-dimensional electron layer of the HEMT device, is to be in proximity to the threshold voltage. To achieve it, the carrier density of the two-dimensional electron layer may be adjusted in advance through modulation doping or the like. When a terahertz wave from the integrated RTD oscillator is further applied, a mixing signal with the oscillation frequency can be detected, allowing the detection with excellent SN ratio.

As described above, this embodiment, which is formed as an electromagnetic wave detection device, also includes a substrate provided with a terahertz wave oscillation section including a resonant tunneling diode structure, a two-dimensional electron layer having a semiconductor heterojunction structure, and a transistor section. The transistor section includes a source electrode and a drain electrode provided at end portions of the two-dimensional electron layer and a gate electrode provided above the two-dimensional electron layer. When this transistor section is irradiated with external terahertz waves, an output corresponding to the intensity of the electromagnetic waves is obtained from the transistor section. A terahertz wave output from the terahertz wave oscillation section is allowed to enter the two-dimensional electron layer to obtain the output of the transistor section as a mixing signal with the oscillation frequency of the terahertz wave from the terahertz wave oscillation section. An electromagnetic wave detector including this electromagnetic wave detection device may be used as a detector 65 illustrated in FIG. 4.

As described above, in the present embodiments, the oscillator including the electromagnetic wave generation device in a terahertz region enables high speed modulation through direct modulation from an external power source. This allows an increase in a transmission capacity for a use as a communication light source, for example. The oscillator may also be formed as, for example, an electromagnetic wave detection device, which is capable of detecting a terahertz wave. Additionally, the present embodiments can provide a device configuration with, for example, high manufacturing yield.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-005056, filed Jan. 16, 2013, and Japanese Patent Application No. 2013-234730, Nov. 13, 2013, which are hereby incorporated by reference herein in their entirety.

What is claimed is:

1. An electromagnetic wave generation device, the device comprising a substrate, the substrate being provided with a terahertz wave oscillation section including a resonant tunneling diode structure,
   a two-dimensional electron layer having a semiconductor heterojunction structure, and
   a transistor section including a source electrode and a drain electrode provided at end portions of the two-dimensional electron layer and a gate electrode provided above the two-dimensional electron layer,
   wherein the terahertz wave oscillation section and the transistor section are arranged on the same side of the substrate, and
   wherein the terahertz wave oscillation section is configured to apply AC electric field of a terahertz wave output of the terahertz wave oscillation section to the source electrode and the drain electrode.

2. The electromagnetic wave generation device according to claim 1, wherein the terahertz wave oscillation section includes a resonator, and the transistor section is connected to the resonator with regard to alternating current.

3. The electromagnetic wave generation device according to claim 2, wherein the terahertz wave oscillation section and the transistor section are in conduction at a frequency band of a terahertz wave from an oscillation of the terahertz wave oscillation section, and are isolated with regard to direct current.

4. The electromagnetic wave generation device according to claim 1, wherein electrical wiring to propagate a terahertz wave from the terahertz wave oscillation section is connected to the transistor section with regard to alternating current.

5. The electromagnetic wave generation device according to claim 1, wherein a modulation signal is applied to the transistor section to output a terahertz wave modulation signal.

6. An apparatus comprising the electromagnetic wave generation device according to claim 1 and
   a power source configured to drive the electromagnetic wave generation device, the apparatus being configured to transmit a terahertz wave signal.

7. An electromagnetic wave generation device, the device comprising a substrate, the substrate being provided with a terahertz wave oscillation section including a resonant tunneling diode structure,
   a two-dimensional electron layer having a semiconductor heterojunction structure, and
   a transistor section including a source electrode and a drain electrode provided at end portions of the two-dimensional electron layer and a gate electrode provided above the two-dimensional electron layer,
   wherein the terahertz wave oscillation section and the transistor section are arranged on two different surfaces of the substrate at opposite positions,
   wherein a terahertz wave output of the terahertz wave oscillation section changes distribution of electrons in the two-dimensional electron layer, and
   wherein at least one of electrodes of the resonant tunneling diode structure and at least one of the electrode of the transistor section constitute a vertical resonator.

8. An apparatus comprising the electromagnetic wave generation device according to claim 7 and a power source configured to drive the electromagnetic wave generation device, the apparatus being configured to transmit a terahertz wave signal.

9. The electromagnetic wave generation device according to claim 7, wherein the terahertz wave oscillation section is arranged such that a terahertz wave from the terahertz wave oscillation section enters the two-dimensional electron layer.

10. The electromagnetic wave generation device according to claim 7, wherein a terahertz wave from the terahertz wave oscillation section propagates inside the substrate.

* * * * *